(12) United States Patent
Agarwal et al.

(10) Patent No.: US 9,081,061 B1
(45) Date of Patent: Jul. 14, 2015

(54) SCAN FLIP-FLOP

(71) Applicants: Amol Agarwal, Noida (IN); Gaurav Goyal, Noida (IN); Reecha Jajodia, Noida (IN)

(72) Inventors: Amol Agarwal, Noida (IN); Gaurav Goyal, Noida (IN); Reecha Jajodia, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/262,789

(22) Filed: Apr. 27, 2014

(51) Int. Cl.
  *H03K 19/173* (2006.01)
  *G01R 31/3177* (2006.01)

(52) U.S. Cl.
  CPC .................................. *G01R 31/3177* (2013.01)

(58) Field of Classification Search
  None
  See application file for complete search history.

(56) References Cited

U.S. PATENT DOCUMENTS

| | | | |
|---|---|---|---|
| 5,784,384 A * | 7/1998 | Maeno | ......................... 714/726 |
| 6,114,892 A | 9/2000 | Jin | |
| 7,231,569 B2 | 6/2007 | Chae | |
| 8,381,144 B2 | 2/2013 | Jen | |
| 8,510,616 B2 | 8/2013 | Singhal | |
| 8,566,658 B2 | 10/2013 | Tekumalla | |
| 2006/0028259 A1 * | 2/2006 | Aksamit | ........................ 327/202 |
| 2007/0016834 A1 | 1/2007 | Debnath | |
| 2009/0309641 A1 * | 12/2009 | Park | .............................. 327/203 |

OTHER PUBLICATIONS

Ahmed, N.; Ravikumar C.P.; Tehranipoor M.; Plusquellic J., "At-Speed Transition Fault Testing With Low Speed Scan Enable," Proceedings of the 23rd IEEE VLSI Test Symposium (VTS'05), 2005.
Rubil Ahmadi, "A Power Efficient Hold-Friendly Flip-Flop," IEEE 978-1-4244-2332-3/0,8, 2008.
Khatri S.P.; Ganesan, S., "A Modified Scan-D Flip-flop Design to Reduce Test Power," Dept.of ECE, Texas A&M University.
Mishra, A.; Sinha, N.; Satdev; Singh, V.; Chakravarty, S.; Singh, A.D., "Modified Scan Flip-Flop for Low Power Testing," Test Symposium (ATS), 2010 19th IEEE Asian , vol., No., pp. 367,370, Dec. 1-4, 2010.

* cited by examiner

*Primary Examiner* — Jany Richardson
(74) *Attorney, Agent, or Firm* — Charles Bergere

(57) ABSTRACT

A scan flip-flop includes a multiplexer, a flip-flop, and a logic circuit. The flip-flop includes a transmission gate that has two sets of clock-controlled transistors. The combined width of the clock-controlled transistors in a set equals the width of the single transistor commonly used in known scan flip-flop circuits. The logic circuit inhibits the clock signal from reaching one transistor of each set during scan mode, which reduces power consumption without sacrificing speed of operation.

21 Claims, 2 Drawing Sheets

SCAN FLIP-FLOP

BACKGROUND OF THE INVENTION

The present invention relates generally to digital circuits and more particularly to a scan flip-flop.

Digital circuits play an important role in a variety of devices. System on Chip (SOC) devices, for example, are becoming more complex and the requirement to meet high performance and low power targets for such complex devices presents an ever-increasing challenge.

Flip-flops are among the basic building blocks used in digital circuits. Flip-flops are used in sequential circuits to store state information. State transitions occur at predetermined times, typically defined by rising or falling edges of a clock signal. A typical flip-flop has a data input, a clock input and a data output. Data at the data input is sampled, and provided at the output, at a rising or falling clock edge. Typically, flip-flops require the sampled input signal to remain stable after the clock edge for a defined duration. This duration is called the hold-time. If the input signal changes before the required minimum duration following the sampling clock edge, a hold-time violation occurs. A typical application where hold-time violations may be observed is in the testing of integrated circuits, LBIST (Logic built-in self-test) procedures, for example.

One known self-test procedure uses a scan test where many flip-flops in the circuit are connected together to effectively form a large shift register. A multiplexer at an input of a flip-flop is set to select either a scan test input during testing, or an ordinary data input during normal operation. A circuit block including a multiplexer and a flip-flop, with the multiplexer having a scan input, a normal data input, and an output interconnected to the input of a flip-flop, is called a scan flip-flop or scan cell. During scan tests, the combinatorial blocks in a circuit may be bypassed as scan test data is shifted into pipeline stages made of scan flip-flops. Scan flip-flops so operated have no combinational logic connected between them and signals propagate from one stage to another very quickly, potentially causing hold-time violations. To counter hold-time violations, buffers are often inserted between scan flip-flops. However, this has the disadvantage of requiring additional silicon area and its associated cost.

Typically, when in test mode (or scan mode), scan test patterns are shifted (or scanned) into flip-flops, the circuit is put into normal mode for one or more cycles, then placed in scan mode again and the contents of the scan registers (test results) are serially shifted out (or scanned out) for comparison with expected output values. The random nature of this test procedure, i.e., the random shifting of data through scan chains causes high switching activity due to the high level of toggling in the LBIST design. Consequently, during such a test procedure, there is high peak and average power consumption. Initial peak power values are a particular concern because the LBIST design moves from a low activity to a very high activity state in a short span of time. If power consumption exceeds certain limits, then shifted data may be corrupted. One known way of reducing power consumption during shift mode involves reducing the shift (clock) frequency. However this has the disadvantage of increasing the test runtime.

Therefore it would be advantageous to provide a scan flip-flop that consumes less power during shift mode without sacrificing performance during a self-test or resistance to hold violations.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
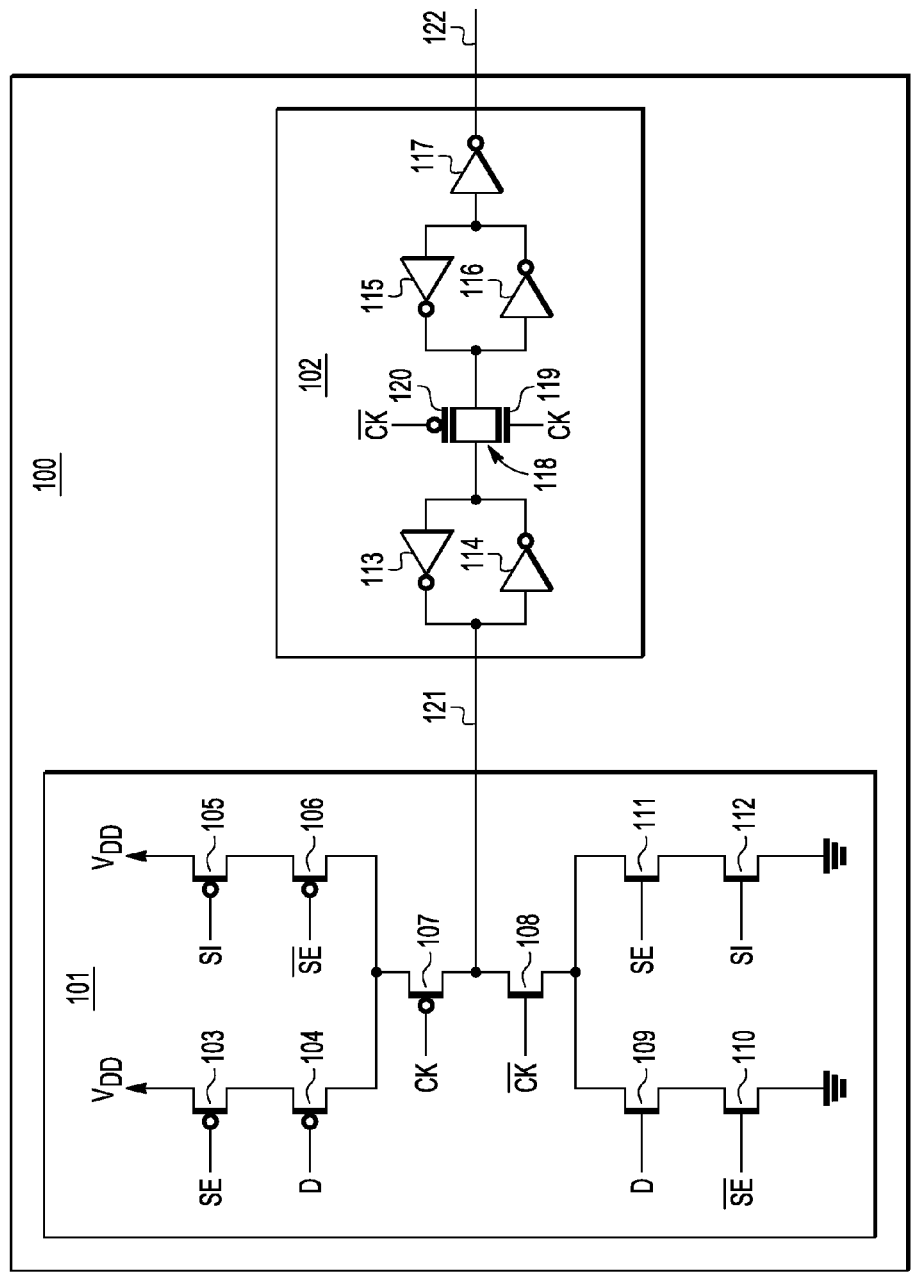
FIG. 1 is a schematic circuit diagram of a conventional scan flip-flop.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

The present invention provides scan flip-flop circuit or cell that can select between a slow clock path or a fast clock path, based on transistor widths build into the cell, so that a slow clock can be used for scan and low power modes and a fast clock can be used (selected) for functional mode.

In one embodiment, the present invention provides a scan flip-flop including a multiplexer, a flip-flop and a logic circuit. An output of the multiplexer is connected to an input of the flip-flop. The flip-flop includes a clock-controlled transmission gate for transferring a signal from an input of the flip-flop to an output of the scan flip-flop. The transmission gate includes first and second pairs of switches, each of the switches of the first and second pairs being connected in parallel with one another. The logic circuit is arranged, in a first mode of operation, to enable clock signals for reception by both of the first and second switches comprising each pair of switches, and in a second mode of operation, to inhibit clock signals from reaching each second switch of each pair of switches.

In one embodiment, the multiplexer of the scan flip-flop includes a clock gating circuit comprising third and fourth pairs of clock-controlled switches for transferring one of two inputs received by the multiplexer to an output thereof. The third pair is connected in series with the fourth pair and each of the third and fourth pairs of switches comprises third and fourth switches that are connected in parallel with each other. The logic circuit is arranged, in a first mode of operation, to enable clock signals for reception by both of the third and fourth switches of each pair of switches that comprise the clock gating circuit and in a second mode of operation, to inhibit clock signals from reaching each fourth switch comprising each pair of switches of the clock gating circuit.

In one embodiment, the first, second, third and fourth switches are MOSFETs (metal oxide semiconductor field effect transistor). By using a pair of clock-controlled transistors, (rather than just one such transistor), whose combined widths are no more than the width of the single transistor used in conventional circuits, and inhibiting one of the pair in scan mode, power saving is achieved.

Referring now to FIG. 1, a schematic circuit diagram of a conventional scan flip-flop 100 that includes a multiplexer 101 and a D-type flip-flop 102 is shown. The multiplexer 101 includes transistors 103-112. Each transistor 103-112 is a metal-oxide-semiconductor-field effect transistor (MOSFET). Transistors 103-107 are p-channel metal oxide semiconductor (PMOS) transistors while transistors 108-112 are n-channel metal oxide semiconductor (NMOS) transistors. A clock gating transistor arrangement comprises two transistors 107 and 108. The gate terminals of the transistors 107 and 108 receive a clock signal (CK) and its inverse (/CK) respectively from an external source (not shown). The drain terminals of the PMOSFET 107 and the NMOSFET 108 are connected together and to an output line 121 of the multiplexer 101.

The flip-flop 102 includes inverters 113-117 and a transmission gate 118. The transmission gate 118 comprises an n-channel MOSFET 119, which receives the clock signal on its gate and a p-channel MOSFET 120, which receives the inverse clock signal (/CK) on its gate. The drain terminal of the NMOSFET 119 is connected to the source terminal of the PMOSFET 120 and the drain terminal of the PMOSFET 120 is connected to the source terminal of the NMOSFET 119.

The MOSFET transistors in the scan flip-flop 100 act as switches and are turned on or off depending on the value of the input signal presented at their gates. A PMOS transistor is generally off when the signal at its gate is high, while an NMOS transistor is generally on when the signal at its gate is high. Conversely a PMOS transistor is on when the signal at its gate is low, while an NMOS transistor is off the signal at its gate is low.

PMOS transistors 103 and 104, which are connected in series, form a two-input AND gate since current can only flow through the transistors if both transistors are on. A scan enable signal (SE) is applied to the gate of the transistor 103 and a data input signal (D) is applied to the gate of the transistor 104. Similarly, transistors 105 and 106 also form an AND gate. A scan input signal (SI) is applied to the gate of the transistor 105 and an inverse scan enable signal (/SE) is applied to the gate of the transistor 106.

Similarly, NMOS transistors 109 and 110 form a two-input AND gate, where the data input signal (D) is applied to the gate of the transistor 109 and the inverse of the scan enable signal (/SE) is applied to the gate of the transistor 110, while NMOS transistors 111 and 112 form an AND gate where the scan enable signal (SE) is applied to the gate of the transistor 111 and the scan input signal (SI) is applied to the gate of the transistor 112.

In operation, when the clock input signal CK is low (logic 0) and its inverse is high (logic 1), the clock gating transistor arrangement 107 and 108 are on, but they are off when the clock input signal CK is high. Thus the signal value on the multiplexer output line 121 is determined by the values of D or SI while the clock is low.

When the scan enable signal (SE) is high, both transistors 103 and 110 are off. Since transistor 103 is off, there is no signal path through transistors 103 and 104 to the multiplexer output line 121. Similarly since transistor 110 is also off, there is no signal path through transistors 110 and 109 to the multiplexer output line 121. However, both transistor 106 and transistor 111 are on. Therefore, the voltage on the multiplexer output line 121 depends on the scan input signal (SI) and the data input signal (D) has no effect.

Conversely, when the scan enable signal (SE) is low, both transistors 106 and 111 are off and there will be no signal path through transistors 105 and 106 or through 112 and 111 to the multiplexer output line 121. However, both transistors 103 and 110 are on so there will be a signal path through transistors 103 and 104 and through 109 and 110 to the multiplexer output line 121. Therefore, in this case, the voltage on the multiplexer output line 121 depends on the data input signal (D), and the scan input signal (SI) has no effect.

Thus, the multiplexer 101 can output either a scan input signal (SI) or a data signal (D) depending on the logical value of the scan enable signal (SE).

The voltage on the output line of the multiplexer 121 is presented at the input of the flip-flop 102 and as the clock input CK transitions to a logical 1 (and /CK transitions to a logical 0) at the transmission gate 118, both transistors 119 and 120 turn on, whereupon the flip-flop 102 presents the value on its input inverted by inverter 117, at its output line 122 until the next clock edge.

Figure 2:
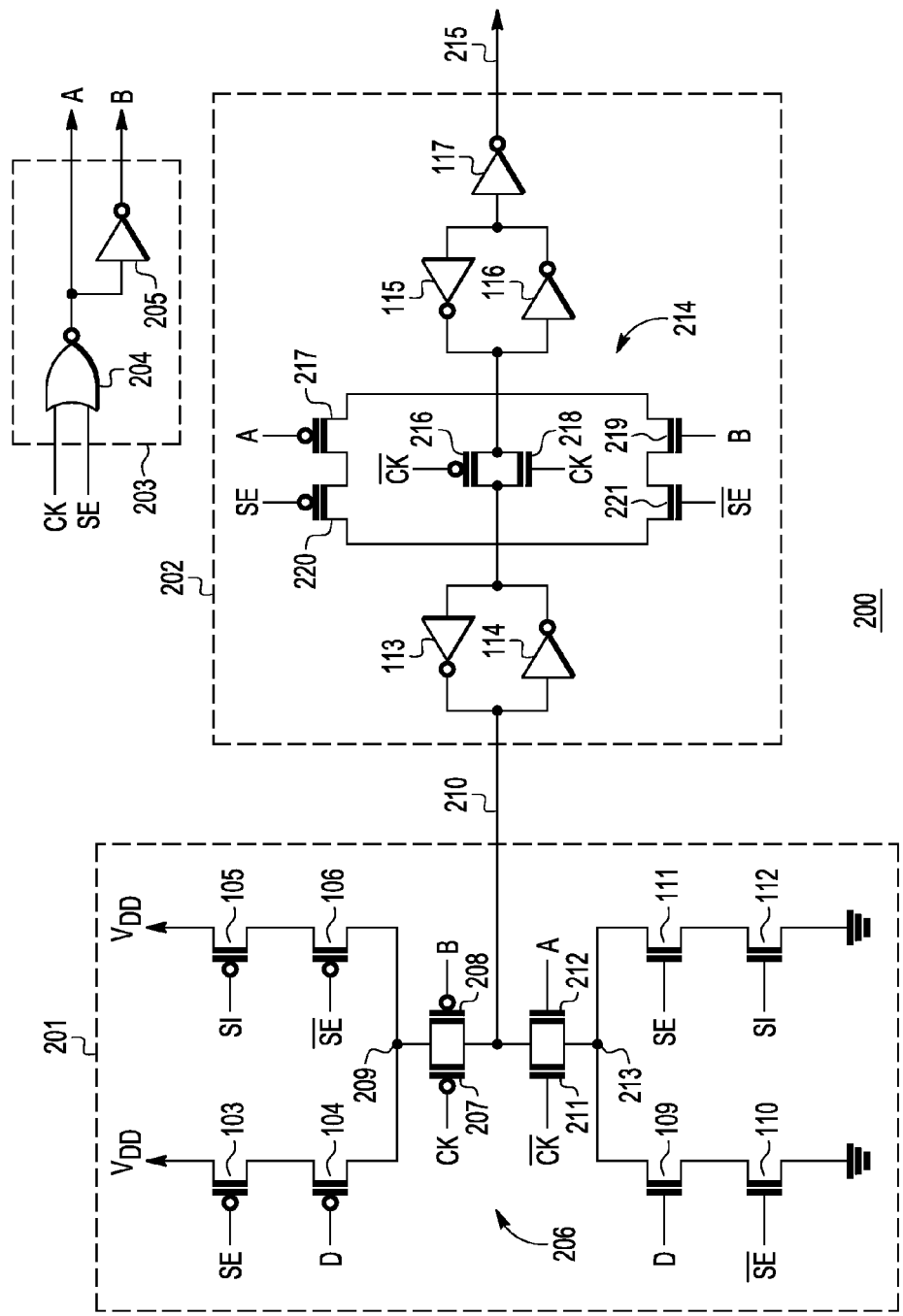
FIG. 2 is a schematic circuit diagram of a scan flip flop in accordance with an embodiment of the invention.

Referring now to FIG. 2, a schematic circuit diagram of a scan flip-flop 200 in accordance with an embodiment of the invention is shown. The scan flip-flop 200 includes a multiplexer 201, a flip-flop 202 and a logic circuit 203. The logic circuit 203 has two inputs, a clock input (CK) and a scan enable input (SE), and generates two outputs A and B. The purpose of the logic circuit 203 is to gate the incoming clock signal (CK) with the scan enable signal (SE). The logic circuit 203 has a NOR gate 204 that receives as inputs CK and SE signals, and an inverter 205 connected to an output of the NOR gate 204. Thus, when the scan enable signal (SE) is low, output A is the inverse of the clock input signal (CK) and output B is equal to the clock input signal, and when the scan enable signal (SE) is high, output A is low irrespective of the value of the clock input (CLK), and output B is high irrespective of the value of the clock input. The NOR gate 204 and the inverter 205 may be realised using two MOSFETs. It will be understood, that there are other gate arrangements that may be used instead of the NOR gate and inverter combination shown in FIG. 2 in order to provide outputs A and B. The purpose and function of outputs A and B will be described below.

The multiplexer 201 includes transistors 103-106 and 109-112, which are configured in the same arrangement and perform the same function as those described with reference to FIG. 1. The multiplexer 201 also includes a clock gating circuit 206. The clock gating circuit 206 comprises two pairs of transistors, a first pair comprises two PMOSFETs 207, 208, and a second pair comprises two NMOSFETs 211, 212. A gate terminal of a first PMOSFET 207 receives the clock input signal (CK) and a gate terminal of the second PMOSFET 208 receives the output B from the logic circuit 203. The source terminals of the PMOSFETs 207, 208 are connected to one another at a common source node 209 and the drain terminals of the PMOSFETs 207, 208 are connected to each other and to an output line 210 of the multiplexer 201. The common source node 209 of the two PMOSFETs 207, 208 receives either the input signal (D) or the scan input signal (SI) as determined by the scan enable signal (SE) and its inverse (/SE), which are supplied to the transistors 103, 106 respectively. The first PMOSFET 207 may have a width W1 and the second PMOSFET 208 may have a width W2. The sum of the two widths (W1+W2) in one example equals the width of the PMOSFET 107 of the gating circuit of the known scan flip-flop 100 of FIG. 1. In one example, W1 is equal to W2. In other examples, W1 and W2 have dissimilar values but their sum is still equal to the width of the transistor 107 of FIG. 1.

The second pair of transistors 211, 212 of the clock gating circuit 206 comprises two NMOSFET. A gate terminal of the first transistor 211 receives the inverse of the clock signal (/CK) and a gate terminal of the second transistor 212 receives the output A from the logic circuit 203. The source terminals of each of the transistors 211, 212 are connected to one another at a common source node 213 and the drain terminals of the transistors 211, 212 are connected to each other and to the multiplexer output line 210. The common source node 213 of the two transistors 211, 212 receives either the input signal (D) or the scan input signal (SI), which are supplied to the transistors 109 and 110 respectively, as determined by the scan enable signal (SE) and its inverse (/SE), which are supplied to the transistors 111 and 110 respectively. The first transistor 211 of the second pair may have a width W1 and the second transistor 212 of the second pair may have a width W2, where the sum of the widths (W1+W2) in one example equals the width of the PMOSFET 107 (or NMOSFET 108) of the known scan flip-flop 100 of FIG. 1. In one example, W1 is equal to W2. In other examples W1 and W2 have dissimilar values.

In operation of the multiplexer 201, when the scan enable signal (SE) is high (i.e., a scan shift mode of operation is to be performed for test purposes), signal B appearing at the gate of the second transistor 208 of the first pair of the gating circuit 206 will be high. Similarly, signal A appearing at the gate of the second transistor 212 of the second pair of the gating circuit 206 will be low. Therefore, each second transistor 208, 212 of the two pairs of transistors of the gating circuit 206 will be held off for as long as the scan enable signal (SE) is high (at a logical 1). During this period, the scan input (SI) will be clocked through to the multiplexer output line 210 by the action of each first transistor 207, 211 of the first and second pairs of transistors of the gating circuit 206. Therefore, under these conditions, when performing a scan operation, the transistor width of the gating circuit 206 is reduced compared with that of the known system of FIG. 1. Hence, due to the smaller transistor width, there will be a reduction in power consumption during these scanning operations. Thus, average and peak power may be reduced during a self-test operation (LBIST) without compromising the time taken to run the test.

When a scan mode of operation is not desired but normal operation (for example "functional" mode or "scan capture" mode) is required, the scan enable signal (SE) is set to a logical 0. Now, the A output signal from the logic circuit 203 is an inverted version of the input clock signal and the B output signal from the logic circuit 203 is the clock signal (CK). Therefore both transistors 207, 208 of the first pair of transistors of the gating circuit 206 receive the clock signal and will turn on together and similarly, both transistors 211, 212 of the second pair of transistors of the gating circuit 206 will receive the inverse clock signal (/CK) and will turn on together. So under such a "normal operation" condition, the data input D will be clocked through to the multiplexer output line 210 by the action of all four transistors 207, 208, 211, 212 of the gating circuit 206. Therefore the gating circuit 206, when operating in a functional (or scan capture) mode, has an effective transistor width of 2W, which is the same as that of the gating circuit 107, 108 of FIG. 1. Thus, by enabling the transistors of width W2 in a normal operational mode, the functional characteristics of the scan flip-flop remain intact.

In common with the conventional circuit illustrated in FIG. 1, the flip-flop 202 of FIG. 2 includes inverters 113-117, which function in a similar fashion. The flip-flop 202 also includes a transmission gate 214 that receives the output from the multiplexer 201 by way of the inverters 113 and 114 and transfers it to an output line 215 of the scan flip-flop 200 by way of the inverters 115-117 on a transition of the clock signal. The transmission gate 214 has two set of transistors. The first set comprises three PMOSFETs 216, 217, 220. A gate terminal of a first transistor 216 of the first set receives the inverted clock input signal (/CK), a gate terminal of a second transistor 217 of the first set receives the output A from the logic circuit 203, and a gate terminal of a third transistor 220 of the first set receives the scan enable signal (SE). The drain terminal of the transistor 220 is connected to the source terminal of the transistor 217, and the source terminals of the transistor 216, 220 are connected to one another at a common source node that receives the output of the multiplexer 210 by way of the inverters 113, 114. The drain terminals of the transistor 216, 217 are connected to each other at a common drain node that forms the input to a gate circuit comprising the inverters 115, 116 and 117. In a preferred embodiment, the first transistor 216 of the first set has a width W1 and the second transistor 217 of the first set has a width W2, where the sum of the two widths (W1+W2) in one example equals the width of the PMOSFET 120 of the transmission gate 118 of the known scan flip-flop of FIG. 1. In one example, W1 is equal to W2, and in other examples, W1 and W2 have dissimilar values.

A second set of transistors of the transmission gate 214 comprises three NMOSFETs 218, 219, 221. A gate terminal of a first transistor 218 of the second set receives the clock signal (CK), a gate terminal of a second transistor 219 of the second set receives the output B from the logic circuit 203, and a gate terminal of a third transistor 221 of the second set receives the inverted scan enable signal (/SE). The drain terminal of the transistor 221 is connected to the source terminal of the transistor 219, and the source terminals of the transistors 218, 221 of the second set are connected to one another and to the common source node of the transistors 216, 220 of the first set, which receives the output of the multiplexer 210 by way of the inverters 113, 114. The drain terminals of the transistors 218, 219 of the second set are connected to each other and to the common drain node of the first transistor set 217, 216, which forms the input to the gate circuit comprising the inverters 115, 116 and 117. The first transistor 218 of the second pair may have a width W1 and the second transistor 219 of the second pair may have a width W2. The sum of these two widths in one example equals the width of the P-channel MOSFET comprising the gating circuit of the known scan flip-flop of FIG. 1. In one example, W1 is equal to W2. In other examples, W1 and W2 have dissimilar values.

In operation of the flip-flop 202, when the scan enable signal (SE) is a high (i.e., a scan shift mode), signal B at the gate of the second transistor 217 of the first set of transistors of the transmission gate 214 will be high. Also, signal A at the gate of the second transistor 219 of the second set of transistors of the transmission gate 214 will be low. Therefore, each of the second transistors 217, 219 of the two sets of transistors of the transmission gate 214 will be held off for as long as the scan enable signal (SE) is high and also the first transistors 220 and 221 of the two sets are held off by virtue of the scan enable signal (SE) and the inverted scan enable signal (/SE). During this period, the input of the flip-flop 202 will be clocked through to the output line 215 by the action of each of the first transistors 216, 218 of the first and second sets of the transmission gate 214. Therefore, under these conditions, when performing a scan operation, the transistor width of the transmission gate 214 is reduced when compared with that of the known system of FIG. 1. Hence, due to the smaller transistor width, there will be a reduction in power consumption during the scan operation. Thus, average and peak power will be reduced during a self-test operation (LBIST) without compromising the time taken to run a test. Further, the shift frequency may be increased in order to reduce testing run time but without incurring additional power consumption, which would be the case for the known scan flip-flop 100. By reducing width W1 (and increasing W2 in order to keep W1+W2 equal to W), power consumption decreases still further. Also, as only the MOSFETs having width W1 are on and MOSFETs of width W2 are off, speed of operation is inherently degraded so hold violations are less likely which, in turn, means that fewer, if any, hold buffers are required. Thus, the present invention has the further advantage of saving on silicon area compared with known systems. The scan flip-flop 200 of the present invention may also help to increase design yield by reducing failures due to peak power overload, which often occur when operating in scan mode. Further, the scan flip-flop 200 of the present invention may serve to relax LBIST constraints by enabling the use of simultaneous partitions during an LBIST procedure.

When a scan mode of operation is not desired but normal operation (for example "functional" mode or "scan capture" mode) is required, the scan enable signal (SE) is set to a logical 0. Now, the A output signal from the logic circuit 203 is the inverted clock signal (/CK) and the B output signal from the logic circuit 203 is the clock signal (CK). Therefore both transistors 216, 217 of the first set of the transmission gate 214 receive an inverted version of the clock signal (/CK) and will turn on together along with the transistor 220, which receives the scan enable signal (SE) at its gate. Similarly, both transistors 218, 219 of the second set of transistors of the transmission gate 214 will receive the clock signal (CK) and will turn on together along with transistor 221, which receives the inverted scan enable signal (/SE). So under such a "normal operation" condition, the D input of the flip-flop 202 will be clocked through to its output line 215 by the action of all six transistors 216, 217, 218, 219, 220, 221 of the transmission gate 214. Therefore the transmission gate 214, when operating in a functional (or scan capture) mode, has an effective transistor width of 2W, which is the same as that of the transmission gate 118 of FIG. 1. Thus, by enabling the transistors of width W2 (in addition to the transistors of width W1) in a normal operational mode, the functional characteristics of the scan flip-flop 200 remain intact and there is no degradation in speed of operation.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated examples may be implemented as circuitry located on a single integrated circuit or within a same device. For example, the scan flip-flop 200 of FIG. 2 may be implemented in an integrated circuit. Such an integrated circuit may be a package containing one or more dies. Alternatively, the examples may be implemented as any number of separate integrated circuits or separate devices interconnected with each other in a suitable manner. For example, an integrated circuit device may comprise one or more dies in a single package with electronic components provided on the dies that form the modules and that are connectable to other components outside the package through suitable connections such as pins of the package and bond wires between the pins and the dies.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A scan flip-flop, comprising:
a multiplexer;
a flip-flop having an input connected to an output of the multiplexer; and
a logic circuit,
wherein the flip-flop includes a transmission gate for transferring a signal from the input of the flip-flop to an output of the scan flip-flop,
wherein the transmission gate includes first and second sets of switches, the first and second sets including respective first and second clock-controlled switches, wherein the first and second clock-controlled switches are connected in parallel with one another, and wherein each of the first and second sets of switches includes a first switch and a second switch, and wherein the logic circuit, in a first mode of operation, enables clock signals for reception by the first and second switches of the first and second sets of switches of the transmission gate, and in a second mode of operation, inhibits the clock signals from reaching the first and second clock-controlled switches of the first and second sets of switches of the transmission gate.

2. The scan flip-flop of claim 1, wherein the first set of switches comprises:
the first clock controlled switch having a gate that receives an inverse of a clock signal (/CK), a source, and a drain;
a first switch having a gate that receives a first output (A) of the logic circuit, and a drain connected to the drain of the first clock controlled switch; and
a second switch having a gate that receives a scan enable (SE) signal, a drain connected to a source of the first switch, and a source connected to the source of the clock controlled switch.

3. The scan flip-flop of claim 2, wherein the second set of switches comprises:
the second clock-controlled switch having a gate that receives the clock signal (CK), a source connected to the source of the first clock-controlled switch at a common source node, and a drain connected to the drain of the first clock-controlled switch at a common drain node;
a third switch having a gate that receives a second output (B) of the logic circuit, and a drain connected to the common drain node; and
a fourth switch having a gate that receives an inverted version of the scan enable (SE) signal, a drain connected to the source of the third switch, and a source connected to the common source node.

4. The scan flip-flop of claim 3, wherein the first set of switches comprise p-channel MOSFETs (metal oxide semiconductor field effect transistor) and the second set of switches comprise n-channel MOSFETs (metal oxide semiconductor field effect transistor).

5. The scan flip-flop of claim 3, wherein the first and second clock-controlled switches each have a same width, W1, and the first and third switches each have a same width W2.

6. The scan flip-flop of claim 5, wherein width W1 is equal to width W2.

7. The scan flip-flop of claim 5, wherein width W1 is less than width W2.

8. The scan flip-flop of claim 1, wherein the multiplexer includes a clock gating circuit comprising:
first and second pairs of clock-controlled switches for transferring one of two inputs received by the multiplexer to the multiplexer output, the first pair of clock-controlled switches being connected in series with the second pair of clock-controlled switches,
wherein each pair of clock-controlled switches of the clock gating circuit comprises third and fourth switches connected in parallel with one another, and
wherein the logic circuit, in the first mode of operation, enables the clock signals for reception by both of the third and fourth switches of each pair of clock-controlled switches of the clock gating circuit, and in a second mode of operation, inhibits the clock signals from reaching the fourth switch of each pair of clock-controlled switches of the clock gating circuit.

9. The scan flip-flop of claim 8, wherein first pair of clock-controlled switches comprises:
a third switch having a gate that receives the clock signal (CK); and
a fourth switch having a gate that receives a second output (B) of the logic circuit, a source connected to a source of the third switch, and a drain connected to a drain of the third switch.

10. The scan flip-flop of claim 9, wherein second pair of clock-controlled transistors comprises:
a fifth switch having a gate that receives the inverse clock signal (/CK); and
a sixth transistors having a gate that receives a first output (A) of the logic circuit, a drain connected to a drain of the fifth switch, and a source connected to a source of the fifth switch.

11. The scan flip-flop of claim 10, wherein the third and fourth switches are PMOSFETs and the fifth and sixth transistors are NMOSFETs.

12. The scan flip-flop of claim 11, wherein widths W1 of the third and fifth transistors are the same as one another and wherein widths W2 of the fourth and sixth transistors are the same as one another.

13. The scan flip-flop of claim 12, wherein width W1 is equal to width W2.

14. The scan flip-flop of claim 1, wherein the logic circuit comprises a NOR gate having inputs for receiving a clock signal (CK) and a scan enable signal (SE), and an inverter having an input connected to an output of the NOR gate.

15. A scan flip-flop that has a data input (D), a scan data input (SI), a scan enable (SE) input, a clock signal (CK), and an output (Q), the scan flip-flop comprising:
a multiplexer;
a flip-flop having an input connected to an output of the multiplexer and an output that provides the output Q; and
a logic circuit that gates the clock signal (CK) with the scan enable (SE) to generate a first output signal (A) and a second output signal (B),
wherein the multiplexer includes:
a clock gating circuit that comprises first and second pairs of transistors, wherein the first pair of transistors comprises:
a first PMOSFET (p-channel metal oxide semiconductor) having a gate that receives the clock signal (CK), and
a second PMOSFET having a gate that receives the second output signal (B) from the logic circuit,
wherein source terminals of the first and second PMOSFETs are connected to one another at a first common source node and drain terminals of the first and second PMOSFETs are connected to each other and the output of the multiplexer, and wherein the first common source node receives either the data input (D) or the scan data input (SI) as determined by the scan enable signal (SE) and its inverse (/SE), and
the second pair of transistors comprises:
a first NMOSFET (n-channel metal oxide semiconductor) having a gate that receives an inverted version of the clock signal (/CK), and
a second NMOSFET having a gate that receives the first output signal (A) from the logic circuit,
wherein source terminals of each of the first and second NMOSFETs are connected to one another at a second common source node, and drain terminals of the first and second NMOSFETs are connected to each other and to the output of the multiplexer, and wherein the second common source node receives either the data input (D) or the scan data input (SI) as determined by the scan enable signal (SE) and its inverse (/SE).

16. The scan flip-flop of claim 15, wherein widths W1 of the first PMOSFET and the first NMOSFET are the same as one another and wherein widths W2 of the second PMOSFET and the second NMOSFET are the same as one another.

17. The scan flip-flop of claim 16, wherein width W1 is equal to width W2.

18. The scan flip-flop of claim 16, wherein a sum of the two widths (W1+W2) equals a width of a PMOSFET of a gating circuit of a conventional scan flip-flop.

19. The scan flip-flop of claim 15, wherein when the scan enable (SE) is low, the logic circuit output A has a value of an inverted clock signal (/CK) and the logic circuit output B has a value of the clock signal (CK), and when the scan enable (SE) is high, the output A is low and the output B is high.

20. The scan flip-flop of claim 19, wherein the logic circuit comprises:
   a NOR gate that receives as inputs the clock signal (CK) and the scan enable (SE) signal and generates the A output signal; and
   an inverter connected to an output of the NOR gate 204 and that generates the B output signal.

21. An integrated circuit including a scan flip-flop, wherein the scan flip-flop comprises:
   a multiplexer that receives a data input (D), a scan data input (SI), a scan enable signal (SE), a clock signal (CK) and an inverted version of the clock signal (/CK);
   a flip-flop having an input connected to an output of the multiplexer; and
   a logic circuit that gates the clock signal (CK) with the scan enable signal (SE) and generates a first output (A) and a second output (B) that is an inverted version of the first output (A),
   wherein the flip-flop includes a clock-controlled transmission gate for transferring a signal from the input of the flip-flop to an output of the scan flip-flop, and wherein the transmission gate includes first and second sets of transistors,
   wherein the first set of transistors comprises:
      a first PMOSFET (p-channel metal oxide semiconductor field effect transistor) having a gate that receives the scan enable signal (SE);
      a second PMOSFET having a gate that receives the first output (A) from the logic circuit, and a source connected to a drain of the first PMOSFET; and
      a third PMOSFET having a gate that receives the inverted clock signal (/CK), a source connected to the source of the first PMOSFET at a common source node, and a drain connected to the drain of the second PMOSFET at a common drain node;
   wherein the second set of transistors comprises:
      a first NMOSFET (n-channel metal oxide semiconductor field effect transistor) having a gate that receives an inverted version of the scan enable signal (/SE), and a sourced connected to the common source node;
      a second NMOSFET having a gate that receives the second output (B) from the logic circuit, a source connected to a drain of the first NMOSFET, and a drain connected to the common drain node; and
      a third NMOSFET having a gate that receives the clock signal (CK), a source connected to the source of the third PMOSFET at the common source node, and a drain connected to the drain of the third PMOSFET at the common drain node; and
   wherein the multiplexer includes a clock gating circuit comprising first and second pairs transistors,
   wherein the first pair of transistors comprises:
      a fourth PMOSFET having a gate that receives the clock signal (CK); and
      a fifth PMOSFET having a gate that receives the second output signal (B) from the logic circuit, a sourced connected to the source of the fourth PMOSFET, and a drain connected to the drain of the fourth PMOSFET; and
   wherein the second pair of transistors comprises:
      a fourth NMOSFET having a gate that receives the inverted clock signal (/CK); and
      a fifth NMOSFET having a gate that receives the first output (A) from the logic circuit, a source connected to the source of the fourth NMOSFET, and a drain connected to the drain of the fourth NMOSFET.

* * * * *